United States Patent
Behrens et al.

(10) Patent No.: US 7,742,297 B2
(45) Date of Patent: Jun. 22, 2010

(54) CERAMIC FOAM ELECTRONIC COMPONENT COOLING

(75) Inventors: William W. Behrens, St. Louis, MO (US); Andrew R. Tucker, Glendale, MO (US)

(73) Assignee: The Boeing Company, Chicago, IL (US)

( * ) Notice: Subject to any disclaimer, the term of this patent is extended or adjusted under 35 U.S.C. 154(b) by 238 days.

(21) Appl. No.: 11/407,433

(22) Filed: Apr. 20, 2006

(65) Prior Publication Data

US 2007/0247808 A1  Oct. 25, 2007

(51) Int. Cl.
H05K 7/20 (2006.01)
H01B 9/06 (2006.01)
F28F 7/00 (2006.01)
H01L 23/34 (2006.01)

(52) U.S. Cl. ............ 361/690; 361/695; 361/699; 361/708; 361/719; 174/15.1; 174/16.1; 165/80.4; 165/80.5; 165/104.33; 165/80.3; 257/714; 257/721

(58) Field of Classification Search ............ 361/690, 361/691, 705, 706, 708, 719; 165/80.2, 185; 257/712, 721; 174/15.1
See application file for complete search history.

(56) References Cited

U.S. PATENT DOCUMENTS

| | | | | |
|---|---|---|---|---|
| 5,270,572 A | * | 12/1993 | Nakajima et al. | ............ 257/714 |
| 5,349,831 A | * | 9/1994 | Daikoku et al. | ............... 62/376 |
| 6,196,307 B1 | | 3/2001 | Ozmat | |
| 6,411,508 B1 | | 6/2002 | Kang et al. | |
| 6,840,307 B2 | * | 1/2005 | Eesley et al. | ............... 165/80.3 |
| 6,870,736 B2 | * | 3/2005 | Lee et al. | ..................... 361/704 |
| 2001/0045270 A1 | * | 11/2001 | Bhatti et al. | ............... 165/80.3 |
| 2003/0230401 A1 | | 12/2003 | Pfister et al. | |
| 2004/0027806 A1 | | 2/2004 | Lin | |
| 2004/0245389 A1 | | 12/2004 | Behrens et al. | |
| 2005/0082037 A1 | | 4/2005 | Thayer et al. | |
| 2005/0084665 A1 | * | 4/2005 | DiChiara | ................. 428/293.4 |
| 2005/0111188 A1 | * | 5/2005 | Bhattacharya et al. | ...... 361/699 |
| 2006/0011336 A1 | * | 1/2006 | Frul | ........................... 165/185 |

* cited by examiner

*Primary Examiner*—Jayprakash N Gandhi
*Assistant Examiner*—Zachary M Pape
(74) *Attorney, Agent, or Firm*—Toler Law Group (57) ABSTRACT

In an exemplary apparatus for cooling an electronic component, a housing defines an inlet port and an exhaust port and a foam member is disposed within the housing. The foam member has a shape that conforms to a shape of at least one surface of an electronic component such that the foam member is receivable thereon in thermal communication. The foam member has a pore size of no more than around 50 micrometers and a porosity of at least around 80 percent. The foam member is arranged within the housing such that coolant is flowable through the foam member. Pore size may be around 35 micrometers and porosity may be around 90 percent. Foam may be a ceramic foam that includes silica, aluminum oxide, and aluminum borosilicate fibers. In an application, at least one exemplary apparatus may be received in thermal communication on an upper case of an electronic chip.

21 Claims, 7 Drawing Sheets

CERAMIC FOAM ELECTRONIC COMPONENT COOLING

BACKGROUND

Integrated circuit chips, such as micro-processor chips, and other electronic components generate heat during operation. These components are generally mounted on printed circuit boards (PCBs). To help ensure proper operation, these components generally are kept at an operating temperature below around 160° F. This means that cooling of some sort must be provided for proper operation of electronic components.

As one example, cold plates are widely used for cooling PCBs where the coolant must be kept separated from the electronic components, such as PCBs used in avionics units on aircraft. Avionics cooling on aircraft is commonly provided by blowing cooled, conditioned air through cold plate heat sinks that are attached to the back sides of PCBs (that is, the side away from the upper case of the chip). A cold plate generally consists of an enhanced heat transfer surface encapsulated in a high aspect ratio rectangular duct. The enhanced heat transfer surfaces are typically some sort of fin arrangement or an open-celled, porous metal foam. Coolant flows through the cold plate from one end to the other end, completely wetting the enhanced heat transfer surface inside. This system cools PCBs mounted to the sides of the cold plate.

Commercial Off-The-Shelf (COTS) chips are designed to dissipate the heat they generate through the upper case of the chip. Therefore, such chips are best cooled by direct cooling of the chip case. Adequate cooling of these chips is not easily achieved by back side cooling, such as by blowing cooled, conditioned air through cold plates attached to the back side of the PCB away from the chip upper case. Because back side cooling of COTS chips is not thermally efficient, COTS chips have historically been used sparingly in military aerospace applications. However, modern military aerospace designs emphasize use of COTS chips as a cost saving measure. Additionally, future commercial aerospace and non-aerospace designs employing such chips will require higher capacity, direct case cooling methods because they are projected to generate significantly more heat than contemporary chips while still having an operating temperature limit of around 160° F.

Research has been conducted on increasing the cooling capacity of direct case cooling designs by increasing the surface area wetted by coolant. This work has centered on increasing the heat transfer area available for cooling the case by attaching fins or foam to the chip case. Machined microchannel fin and pin fin arrays as well as metal foam designs have been tested. However, machined microchannel fin and pin fin arrays involve complicated and expensive manufacturing methods. Typical methods for generating chip surface microchannels include photolithography, plasma etching, and photochemical machining. Furthermore, only a single row of microchannels can be created on the chip surface. Multiple rows cannot be stacked on top of each other, thereby greatly reducing the area available for heat transfer and the amount of cooling air that can be utilized for heat removal. Metal foams are limited as to how much the heat transfer surface area can be increased.

Machined microchannel fin, pin fin array and metal foam chip case cooling systems are also only attached to the top surface of electronic component cases. This constitutes a further limit on the area available for heat transfer from a chip case. Attaching fin designs to both the top and sides of a chip case and then getting coolant to flow in a controlled manner over all the fins would be a difficult, costly design problem to solve. Metal foam could be machined to conform to a chip case, but it would be expensive. Furthermore, the outer surface of the foam would have to be sealed using an expensive, complex brazing or welding process.

It would be desirable to improve the thermal efficiency of direct case chip cooling by employing a design having a larger internal surface area available for heat transfer than existing designs, and that could be inexpensively manufactured and easily machined to fit conformally over the top and sides of a chip case. Such an improved approach to chip cooling could enable the wide use of COTS chips in aerospace applications and could enable higher-powered computer chips to be utilized in commercial aerospace and non-aerospace applications.

Specifically for aerospace applications, more thermally efficient chip case cooling designs would be attractive because the cooling air would commonly be generated by an aircraft environmental control system (ECS). However, generation of this cooling air by an ECS constitutes a system performance penalty for the aircraft, because the ECS generates cooling air by extracting air from the aircraft's engine and cooling it with ram air ducted into the vehicle from outside. Extracting air from the engine reduces the air available for generating thrust while capturing ram air increases aircraft drag. These effects ultimately reduce range and/or payload for an aircraft.

Therefore, it would be desirable to reduce the amount of air required to cool avionics chips, thereby reducing the system performance penalty for an air vehicle by increasing vehicle thrust and/or lowering fuel consumption. It would also be desirable to address cooling of future high power electronics that are projected to generate significantly more heat than contemporary chips while still having an operating temperature limit of around 160° F. This will require making more efficient use of the cooling air available.

The foregoing examples of related art and limitations associated therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems and methods which are meant to be exemplary and illustrative, not limiting in scope. In various embodiments, one or more of the problems described above in the Background have been reduced or eliminated, while other embodiments are directed to other improvements.

In an exemplary apparatus for cooling an electronic component, a housing defines an inlet port and an exhaust port and a foam member is disposed within the housing. The foam member has a shape that conforms to a shape of at least one surface of an electronic component such that the foam member is receivable thereon in thermal communication. The foam member has a pore size of no more than around 50 micrometers and a porosity of at least around 80 percent. The foam member is arranged within the housing such that coolant is flowable through the foam member.

According to an aspect, the pore size may be around 35 micrometers. Also, the porosity may be around 90 percent. An exemplary foam may be a ceramic foam, such as a hyperporous, microchannel alumina silica ceramic foam that includes silica, alumina, and aluminum borosilicate fibers.

According to another aspect, the housing may be made from an impermeable sealant. Moreover, the impermeable sealant may additionally bond the foam member to a case of the electronic component.

In an advantageous application, at least one exemplary apparatus may be received in thermal communication on an upper case of an electronic chip. In such an application, the foam member is received in thermal communication on at least one of a top and sides of the chip case. Moreover, the impermeable sealant may further bond the foam member to the case.

In addition to the exemplary embodiments and aspects described above, further embodiments and aspects will become apparent by reference to the drawings and by study of the following detailed description.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

DETAILED DESCRIPTION

Figure 1:
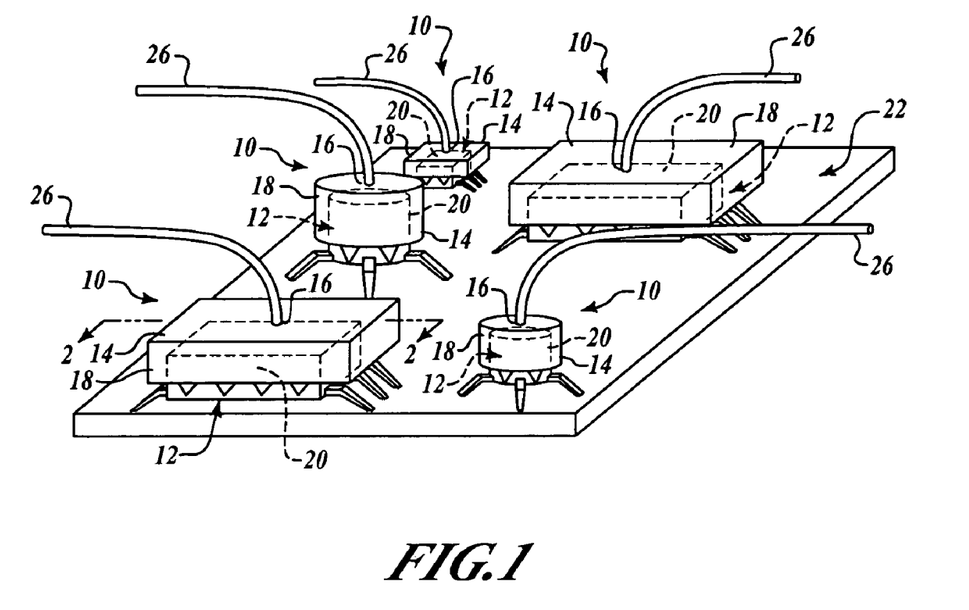
FIG. 1 is a perspective view of electronic components mounted on a circuit board and cooled by an exemplary apparatus.

By way of overview and referring to FIG. 1, an exemplary apparatus 10 for cooling an electronic component 12 includes a foam member 18 encapsulated on its outer surface with an adhesive sealant forming a housing 14. An inlet port 16 penetrates the housing 14 so that coolant may be introduced into the foam member 18. The electronic component 12 includes a case 20 that forms an outer surface of the electronic component 12. The foam member 18 has a shape that conforms to a shape of the case 20 such that the foam member 18 is receivable on the case 20 in thermal communication with the case 20 and, ultimately, the electronic component 12. The foam member 18 has a pore size of no more than around 50 micrometers and a porosity of at least around 80 percent. The foam member 18 is encapsulated in the housing 14 such that coolant is contained within and flowable through the foam member 18. Details of exemplary embodiments and applications will be set forth below.

Still referring to FIG. 1, the electronic component 12 suitably is any printed circuit board (PCB) component or electronic chip. In an exemplary embodiment, the apparatus 10 is particularly well-suited for use with electronic components 12 that are commercial off-the-shelf (COTS) electronic components, because they tend to dissipate most of the heat they generate through the top side of the case 20, opposite the circuit board 22. Advantageously, the foam member 18 is receivable on the sides and upper surfaces of the case 20 in thermal communication therewith to transfer heat generated within the electronic component 12 through the case 20 and into coolant flowing through the foam member 18. COTS electronic components include without limitation processors, microprocessors, controllers, microcontrollers, amplifiers, power amplifiers, transistors, power transistors, thermistors, and the like. The electronic components 12 may be mounted on a side of a circuit board 22 in any acceptable manner, such as via surface mount technology.

Use of the apparatus 10 is not limited to COTS electronic components. For example, given by way of non-limiting example, the apparatus 10 is also well-suited for use with electronic components used in avionics units and with military-specification electronic components. Further, the apparatus 10 advantageously can enable higher-powered computer chips to be utilized in both aerospace and non-aerospace applications.

Figure 2A:
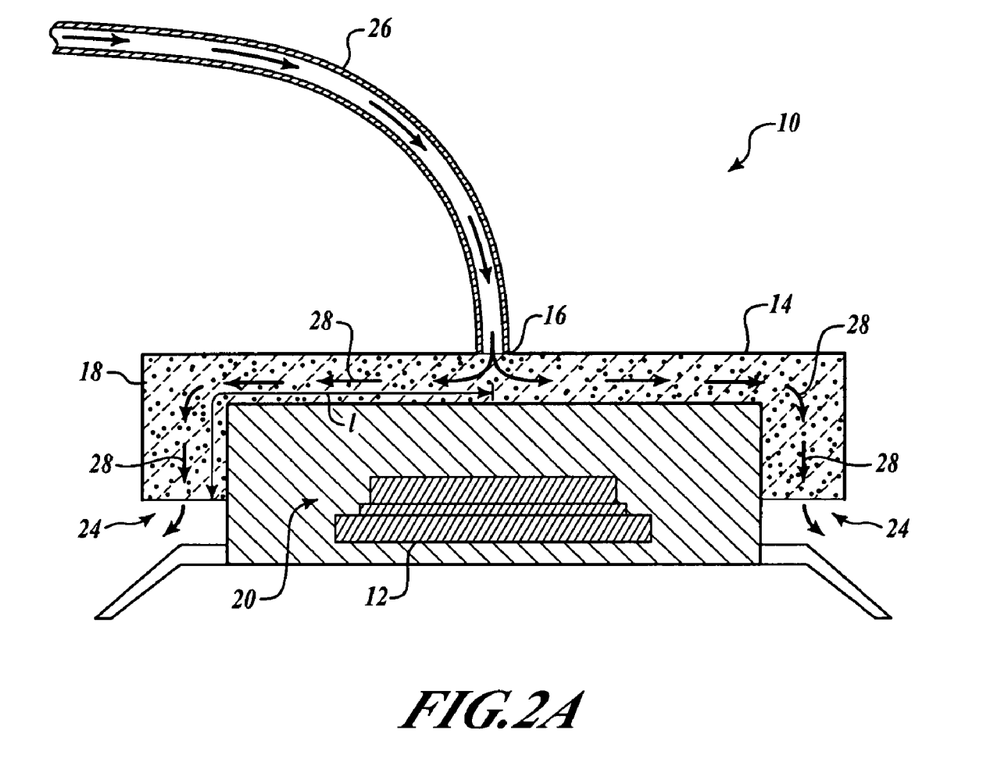
FIG. 2A is a side view of an exemplary apparatus of FIG. 1.
Figure 2B:
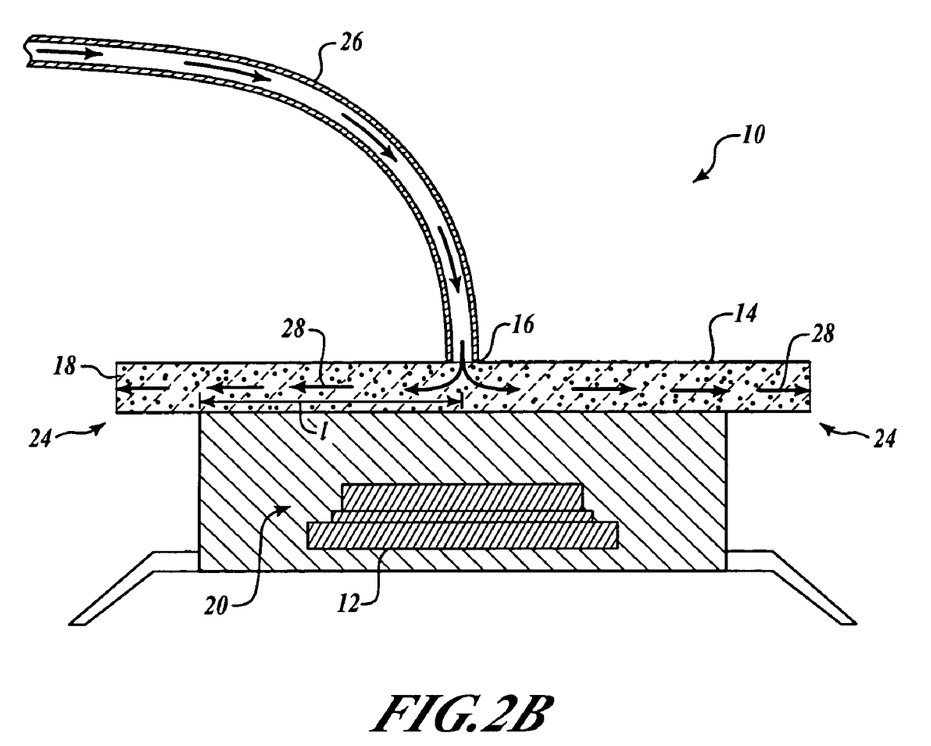
FIG. 2B is a side view of another exemplary apparatus of FIG. 1.

Referring additionally to FIGS. 2A and 2B, the adhesive sealant layer that forms the housing 14 impermeably seals most of the exterior surface of the foam member 18. The inlet port 16 penetrates the housing 14 and may or may not penetrate the foam member 18. In FIG. 2A, an exit port 24 is defined by a surface area of the foam member 18 that extends about the lower sides of the electronic component 12 and is not sealed by the housing 14. In FIG. 2B, the exit port 24 is defined by a surface area of the foam member 18 that extends past the sides of the electronic component 12 and is not sealed by the housing 14. In an exemplary embodiment, an inlet duct 26 is coupled to receive coolant, such as without limitation cooling air, from a source (not shown, such as an environmental control system (ECS) of an aircraft) and is coupled to the inlet port 16. The housing 14 ensures all coolant flows through the foam member 18. Given by way of non-limiting example, in one exemplary embodiment the housing 14 suitably is made from an impermeable, adhesive sealant, such as without limitation a high conductivity room temperature vulcanizing (RTV) silicone. However, the housing 14 suitably may be made from any impermeable, adhesive sealant as desired for a particular application. Another non-limiting example of a impermeable, adhesive sealant from which the housing 14 may be made includes a conductive epoxy.

The foam member 18 is formed in an inverse-shape of at least one surface of the electronic component 12. FIG. 2A shows the foam member 18 formed in an inverse shape of both the top and sides of the electronic component 12. FIG. 2B shows the foam member 18 formed in an inverse shape of only the top surface of the electronic component 12. The foam member 18 may be formed by any acceptable process, such as by machining, casting, and the like, depending on the composition of the foam member 18. The foam member 18 is bonded to the case 20 of the electronic component 12 using the same impermeable, adhesive sealants referred to above for forming the housing 14.

The foam member 18 transfers heat from the electronic component 12 to the coolant flowing through the foam member 18. The coolant flows through the inlet duct 26 and penetrates the housing 14 via the inlet port 16. The coolant is confined by the housing 14 and is caused to flow through the foam member 18 a cooling length l—that is, the length the coolant flows through the foam member 18 during which heat generated by the electronic component 12 is transferred to the coolant. The cooling length l typically is less than around one inch, and in general may be less than around one-fourth of an inch. The coolant flows through the foam member 18 as shown by arrows 28 over substantially all of the top and upper sides of the case 20, as depicted in FIG. 2A, and only over the top surface of the case 20, as shown in FIG. 2B. Advantageously and as will be discussed below, the coolant readily flows within the foam member 18 and a uniform distribution of the coolant results even if the coolant is introduced and exited from different sides of the foam member 18. Heat is conducted through the case 20 of the electronic component 12, is conducted to the solid matrix of the foam member 18, and is in turn transferred by convection to the coolant flowing through the foam member 18. Advantageous heat transfer characteristics of the foam member 18 will be discussed below. The coolant then exits the foam member 18 via the exit port 24.

Advantageously, the foam member 18 is made of material that has a small pore size as well as high porosity. The pore size suitably is on the order of no more than around 50 micrometers or so. Given by way of non-limiting example, in one exemplary embodiment the pore size is on the order of around 35 micrometers. As a result, the coolant advantageously flows through a large number of naturally occurring microchannels. This advantageous approach is in contrast to conventional chip case cooling methods based on flowing coolant through microchannels machined into blocks of solid material that are attached to the case. Designs of this conventional type are more expensive to make. The material of the foam member 18 is also suitably hyperporous. To that end, porosity is on the order of at least around 80 percent or so. Given by way of a non-limiting example, in one exemplary embodiment porosity is on the order of around 90 percent.

A small pore size in combination with hyperporosity greatly increases internal surface area-to-volume ratio, or surface area density, of the material of the foam member 18. Therefore, this surface area-to-volume ratio greatly increases the heat transfer capability of the foam member 18. Because the pore size of the material of the foam member 18 is more than an order of magnitude smaller than the pore size of currently known metal foams having the same porosity, the internal surface area-to-volume ratio of the foam member 18 is more than an order of magnitude greater. Similarly, the foam member 18 material has a much greater internal surface area than can be achieved by machining microchannels in a solid block of material.

The foam member 18 is also made from a material that is easily machined to allow intimate contact between the foam member 18 and the case surface of PCB components. Furthermore, the foam member 18 is made from a material that is both easily sealed and easily attached to the chip case using RTVs or epoxies. This is in contrast to metal foams, which are sealed using complex, expensive sintering or brazing operations.

Figure 3:
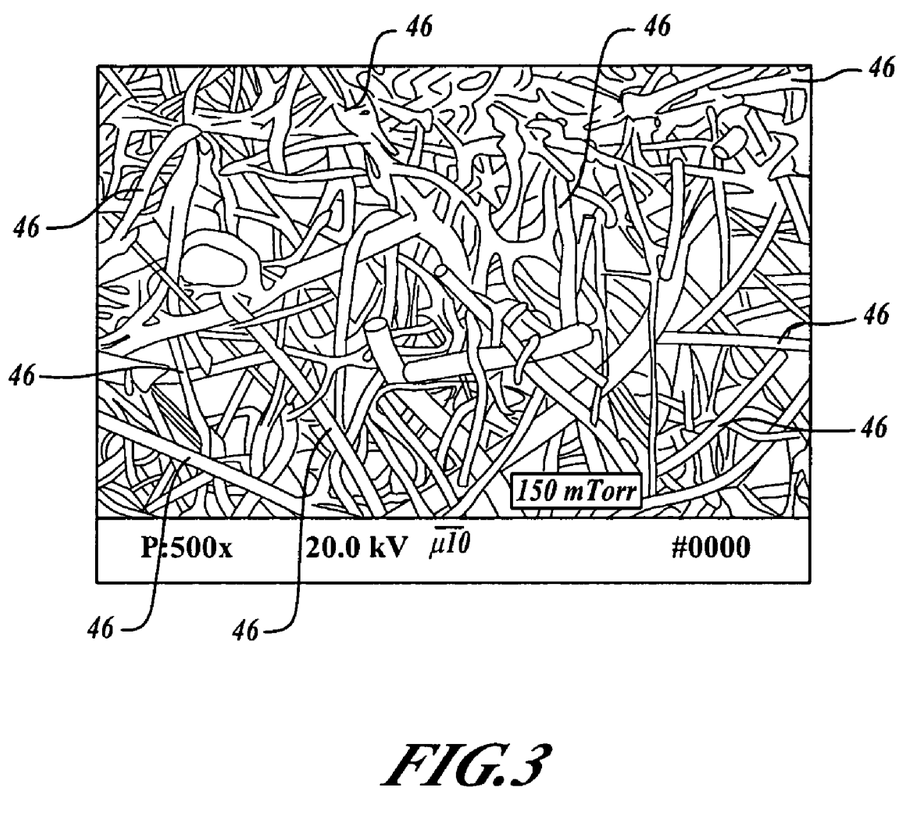
FIG. 3 illustrates pore size of exemplary ceramic foam.

The foam member 18 may be made of any open-cell foam material that combines small pore size and hyperporosity as described above. Given by way of non-limiting example, ceramic foam suitably is used as the material for the foam member 18. In one exemplary and non-limiting embodiment, a ceramic foam that is especially well-suited for the foam member 18 is a hyperporous, microchannel (that is, small pore size on the order of around 35 micrometers) alumina silica ceramic foam that includes up to around 68 percent silica, around 20 percent alumina, and around 12 percent alumina borosilicate fibers. One example of such an exemplary ceramic foam is Alumina Enhanced Thermal Barrier (AETB), made by The Boeing Company, Huntington Beach, Calif. FIG. 3 illustrates an electron micrograph of fibers 46 of AETB, indicating a pore size on the order of around 35 micrometers.

In addition, AETB exhibits several other properties that make AETB especially well-suited for use as material for the foam member 18. For example, AETB ceramic foam is not fragile and has a compressive strength of around 150 psi. Further, AETB is easily machined into complex shapes—such as an inverse shape of the case 20. Moreover, AETB is easily sealed with thermal sealants such as RTVs or epoxies.

The advantageous heat transfer characteristics and flow properties of the apparatus 10 and the foam member 18 (FIGS. 1 and 2) have been quantified by analysis and validated by testing. Analyses have shown that employing ceramic foam with an internal surface area more than an order of magnitude greater than that which can be achieved with fin array and metal foam designs provides greatly enhanced cooling capability in a chip case cooling system. The internal convective heat transfer coefficient, denoted as h, that corresponds to a nominal set of test conditions from an AETB ceramic foam cooling capacity test was quantified by a heat transfer analysis. The internal convective heat transfer coefficient needed to achieve an average top cover plate temperature and bottom cover plate temperature of 122° F. was determined for AETB foam and for a conventional metal foam with the trade name DUOCEL. AETB ceramic foam with a porosity of 0.9 and an average pore size of 35 micrometers has a thermal conductivity of 0.05 BTH/hr-ft-degree R and an internal surface area-to-volume ratio of 31,350 ft$^2$/ft$^3$. Conversely, DUOCEL metal foam with a porosity of 0.9 and an average pore size of 508 micrometers has a thermal conductivity of 5.6 BTH/hr-ft-degree R and an internal surface area-to-volume ratio of only 860 ft$^2$/ft$^3$. The internal convective heat transfer coefficient was determined according to the relationship $$Q = h_{conv} A (122° F. - 70° F.) \quad (1)$$

where

Q=177 W; and $T_{top\ and\ bottom\ cover\ plates}$=122° F.

$T_{coolant}$=70° F.

The results of the analysis are shown below in Table 1.

TABLE 1

| Foam Thickness (in) | $A_{DUOCEL}/A_{AETB}$ | $h_{DUOCEL}/h_{AETB}$ |
| --- | --- | --- |
| 0.25 | 0.03 | 11.5 |
| 0.75 | 0.03 | 4.2 |

The high internal surface area of the AETB ceramic foam more than offsets its low thermal conductivity. The h value needed for the DUOCEL metal foam was 11.5 times greater than that needed for the AETB ceramic foam at a given heat load. A higher coolant flow rate is needed to produce a higher h value. Therefore, a significantly higher coolant flow rate would be required to absorb a given amount of heat for a DUOCEL metal foam chip case cooling compared to the apparatus 10. This result applies by extension to microchannel and pin fin array designs having surface area on an order of magnitude similar to DUOCEL metal foam. Thus, the apparatus 10 provides superior chip cooling performance compared to metal foam and fin array chip case cooling systems, because the lower coolant flow rate translates into a lower air vehicle penalty.

A cooling capacity test was performed that compared a free flowing duct with no enhanced heat transfer surfaces to AETB ceramic foam. Aluminum plates were bonded to both sides of the AETB ceramic foam. Conduction heaters were attached to the outside of the aluminum plates for both the free flowing duct and AETB foam specimens. These heaters generated a total heat load on each specimen of 158 W. A single upstream plenum fed cooling air into the specimens at one end. Coolant then flowed 6 inches through each specimen and was exhausted from the end opposite the plenum. Both specimens were 0.25 inches thick.

Results from the testing showed that, to maintain an average aluminum plate temperature of 115° F., the free flowing duct needed 3 lb/min of cooling air compared to only 1 lb/min for the AETB foam specimen. Therefore, the AETB foam specimen lowered the required coolant flow rate by a factor of 3 for the 158 W heat load.

These cooling capacity test results may be extended to a discussion of the thermal performance of the apparatus 10. The free flowing duct specimen represents a lower bound on heat transfer area for chip case cooling. The internal surface area of fin array and metal foam designs should place their thermal performance between that of the free flowing duct specimen and the AETB ceramic foam specimen.

The small 35 micrometer pores found in the foam member 10 cause rarefaction of the flow through the material which advantageously reduces pressure drop. Rarefaction occurs because the flow channel size approaches the mean free path of the individual air molecules in the coolant flow. This means that the flow can no longer be considered as a continuum and instead is considered in terms of the path of individual particles through a channel. Rarefaction ultimately results in a non-zero "slip" velocity at the walls bounding a channel and an attendant reduction in pressure drop for the flow, compared to what would be expected for continuum flow and a no-slip boundary. This behavior was seen in testing, as shown in FIG. 4.

Figure 4:
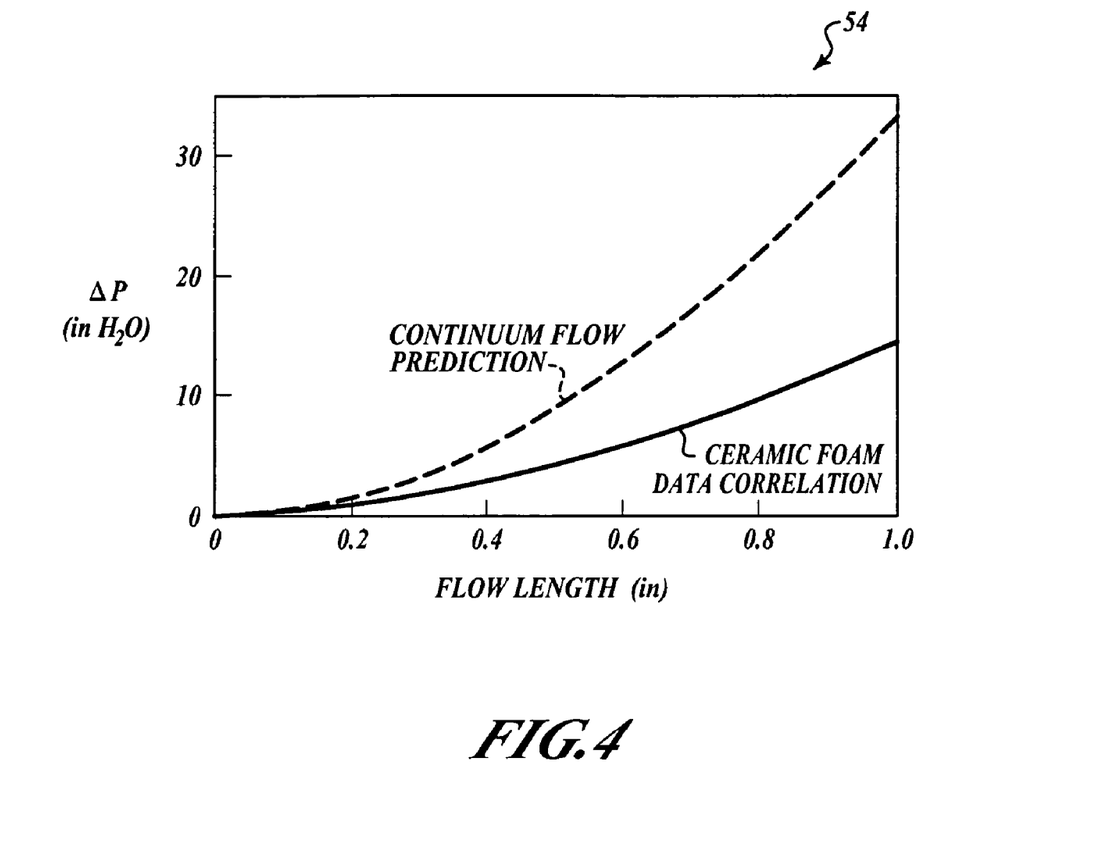
FIG. 4 is a graph of pressure drop versus flow length for exemplary ceramic foam material.

Referring to FIG. 4, a graph 54 plots pressure drop versus flow length. The slip flow produced by rarefaction in the foam member 18 reduces the pressure drop by 20 percent to 50 percent compared to what would be expected under the continuum flow assumption. The graph 54 also indicates that pressure drop for cooling lengths (that is, the cooling length l of the foam member 18) under approximately 1 inch are comparable to pressure drop of conventional metal foam material. This reduction in pressure drop due to small pore rarefaction along with the extremely high internal surface area already discussed work in concert to provide the apparatus 10 with convective heat transfer capabilities far superior to what can be achieved with fin arrays or metal foams.

Figure 5A:
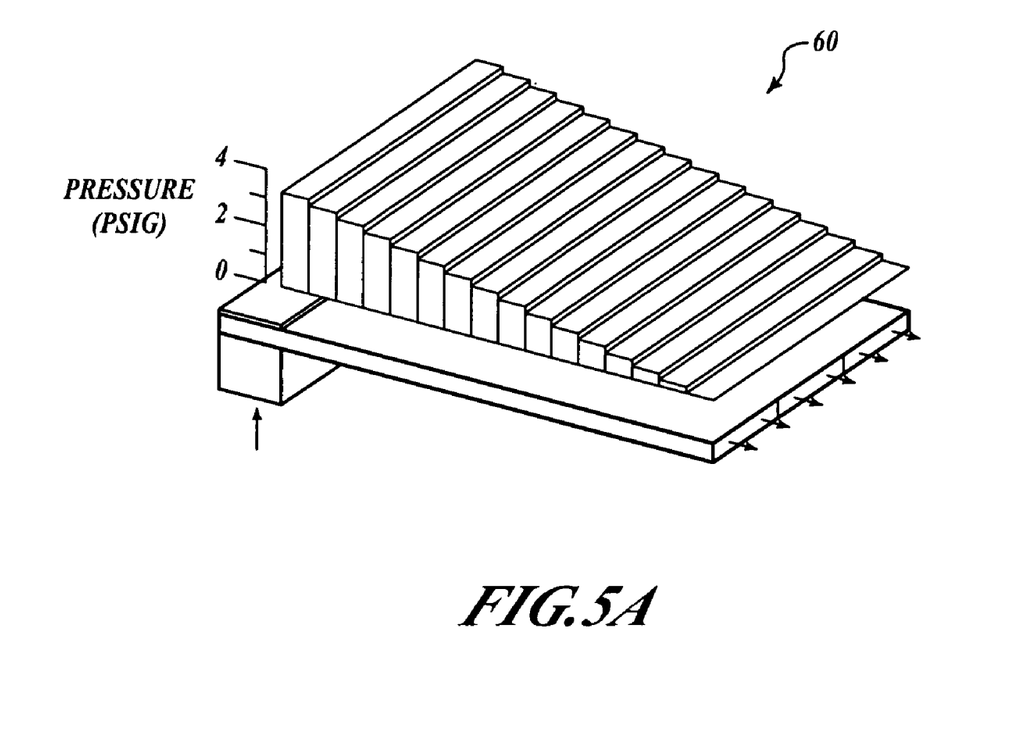
FIGS. 5A and 5B illustrate coolant pressure distribution within exemplary ceramic foam material.
Figure 5B:
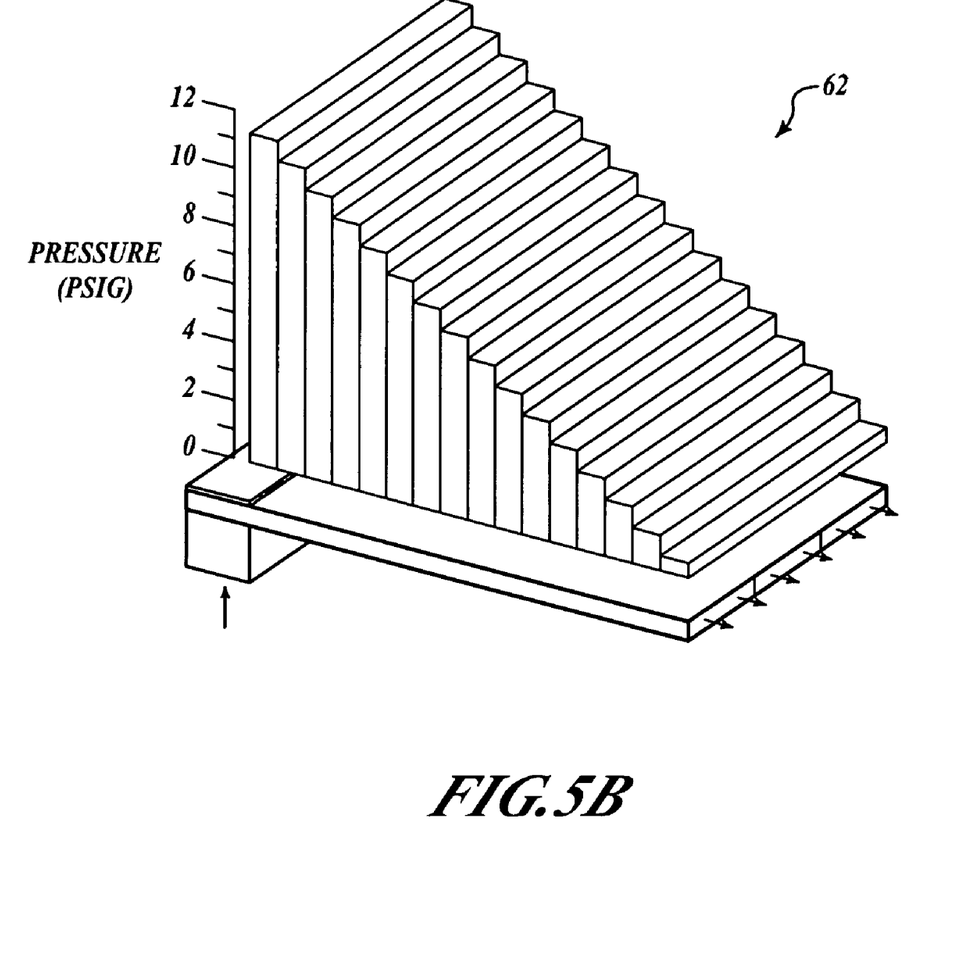

Referring now to FIGS. 5A and 5B, testing has shown that coolant readily flows within AETB and a uniform distribution of the coolant results from the entrance into the foam to the exit. A pressure distribution test was conducted for an 18.0 inch×20.25 inch×¾ inch AETB sample at 3.7 psig plenum pressure (FIG. 5A) and at 12.8 psig plenum pressure (FIG. 5B). Cooling air was introduced through two rows of 0.09 inch diameter holes drilled 0.3 inch into the lower surface of the foam. Entrance holes were drilled into the foam because the AETB sample was wrapped in an impermeable erosion coating. The cooling air traveled approximately 18 inches within the foam before exiting out 2 rows of 0.09 inch diameter holes drilled 0.3 inch into the edge of the sample. As shown in FIGS. 5A and 5B, coolant pressure distributions 60 and 62 within the foam were uniform with minimal variation across the sample width or thickness. The isotropic behavior of the coolant flow through the foam seen in this test indicates that coolant will similarly be uniformly distributed from the inlet port 16 to the exit port 24 (FIG. 2).

While a number of exemplary embodiments and aspects have been illustrated and discussed above, those of skill in the art will recognize certain modifications, permutations, additions, and sub-combinations thereof. It is therefore intended that the following appended claims and claims hereafter introduced are interpreted to include all such modifications, permutations, additions, and sub-combinations as are within their true spirit and scope.

What is claimed is:

1. An apparatus for cooling an electronic component, the apparatus comprising:
a foam member having a shape that conforms to a shape of at least a top surface of an electronic component such that the foam member is receivable thereon in thermal communication with at least the top surface of the electronic component, the foam member having a pore size of less than 50 micrometers and a porosity of at least around 80 percent, the foam member being arranged such that coolant is flowable through the foam member; and
a housing partially covering the foam member, wherein the housing includes:
an inlet port, approximately above a center of the top surface of the electronic component,
wherein at least one side of the foam member is not covered by the housing, and wherein the coolant received at the inlet port exits the foam member through the at least one side of the foam member that is not covered by the housing.

2. The apparatus of claim 1, wherein the pore size is about 35 micrometers.

3. The apparatus of claim 1, wherein the porosity is about ninety percent.

4. The apparatus of claim 1, wherein the foam member includes ceramic foam.

5. The apparatus of claim 4, wherein the ceramic foam includes silica; aluminum oxide; and aluminum borosilicate fibers.

6. The apparatus of claim 1, wherein the housing is made from an impermeable sealant, and wherein the impermeable sealant further adheres the foam member to the top surface of the electronic component.

7. The apparatus of claim 1, wherein the at least one side of the foam member that is not covered by the housing is below the top surface of the electronic component so that the coolant received at the inlet port flows through the foam member over the top surface and over at least a portion of sides of the electronic component before exiting via the at least one side of the foam member that is not covered by the housing.

8. The apparatus of claim 1, wherein the foam member extends past a plurality of edges of the top surface of the electronic component, and wherein the at least one side of the foam member that is not covered by the housing includes each side of the foam member past the edges of the top surface.

9. The apparatus of claim 1, wherein the at least one side of the foam member that is not covered by the housing includes a side of the foam member that is parallel to the top surface of the electronic component and that is below the top surface of the electronic component from the inlet port.

10. A method of cooling an electronic component, the method comprising:
flowing coolant into a housing at least partially covering a foam member at an entrance adjacent to a center of a top surface of an electronic component, wherein the foam member substantially uniformly distributes the coolant from the entrance through the foam member, and wherein the foam member has a pore size less than about 50 micrometers and a porosity of at least about 80 percent; and
discharging the coolant from the housing and the foam member at one or more sides of the foam member that are not covered by the housing and that are beyond at least one side of the electronic component.

11. The method of claim 10, wherein the electronic component includes a chip having a case with a top and sides, and wherein the foam member is received in thermal communication on at least one of the top and the sides of the case.

12. The method of claim 10, wherein the coolant includes cooling air.

13. A circuit board assembly comprising:
a circuit board having at least one electronic component mounted on a side of the circuit board; and
an apparatus for cooling the electronic component, the apparatus being attached in thermal communication to the electronic component, the apparatus including:
a housing defining an inlet port adjacent to a center of a top surface of the electronic component; and
a foam member partially covered by the housing, the foam member having a shape that conforms to a shape of the top surface of the electronic component, the foam member having a pore size of less than 50 micrometers and a porosity of at least around 80 percent, wherein coolant is flowable through the foam member along the top surface of the electronic component and exits the foam member and the housing through at least one side of the foam member that is not covered by the housing.

14. The circuit board assembly of claim 13, wherein an average pore size of the foam member is about 35 micrometers.

15. The circuit board assembly of claim 13, wherein the porosity is about ninety percent.

16. The circuit board assembly of claim 13, wherein the foam includes ceramic foam.

17. The circuit board assembly of claim 13, wherein the housing is made from an impermeable sealant.

18. The circuit board assembly of claim 17, wherein the impermeable sealant further bonds the foam member to the top surface of the electronic component.

19. The circuit board assembly of claim 13, wherein the electronic component includes a chip having a case including the top surface and a base removed from the top surface by a plurality of sides, and wherein the foam member is received in thermal communication with the top surface and at least one side of the plurality of sides of the case, and wherein the at least one side of the foam member that is not covered by the housing is adjacent to the at least one side of the plurality of sides of the case and open toward the base to allow the coolant to exit by flowing toward the base of the electronic component.

20. The circuit board assembly of claim 13, wherein the coolant includes cooling air.

21. The circuit board assembly of claim 13, wherein the coolant has a non-zero slip velocity at walls of pores of the foam member.

* * * * *